July 7, 1959 R. L. ANDERSON 2,894,152

CRYSTAL DIODE WITH IMPROVED RECOVERY TIME

Filed May 16, 1955

INVENTOR
RICHARD L. ANDERSON

BY

Alvin J. Riddles
AGENT

United States Patent Office 2,894,152

Patented July 7, 1959

2,894,152

CRYSTAL DIODE WITH IMPROVED RECOVERY TIME

Richard L. Anderson, Syracuse, N.Y., assignor to International Business Machines Corporation, New York, N.Y., a corporation of New York Application May 16, 1955, Serial No. 508,540

9 Claims. (Cl. 307—88.5)

This invention relates to crystal diodes and more particularly to crystal diodes having fast pulse recovery time.

In the application of crystal diodes to pulse type circuitry, a characteristic of semi-conductor material known as minority carrier storage results in a finite time being required for a semi-conductor to convert from a state of conduction to a state of non-conduction. This time is referred to in the art as recovery time. In certain types of circuit applications, it is desirable to limit this recovery time to a value that is as small as possible.

Briefly, the recovery time of a semi-conductor diode has been found to be appreciably shortened when an electric field is present in the semi-conductor material and this field is of sufficient magnitude that the velocity of drift of the carriers as a result of the influence of the field is greater than the velocity of diffusion of the carriers.

Accordingly, a primary object of this invention is to provide a method of improving the recovery time of semi-conductor diodes.

Another object of this invention is to provide a point contact diode with improved recovery time.

Still another object of this invention is to provide a junction diode with improved recovery time.

Still another object is to provide a gold bonded junction diode with improved recovery time.

Other objects of the invention will be pointed out in the following description and claims and illustrated in the accompanying drawings, which disclose, by way of example, the principle of the invention and the best mode, which has been contemplated, of applying that principle.

Figure 1:
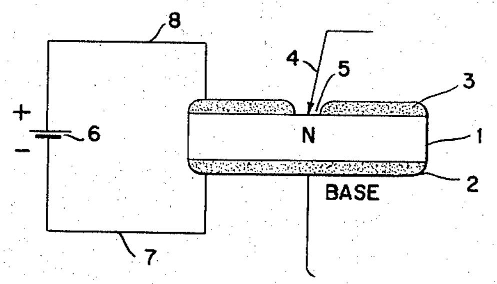
Figure 1 shows a point contact diode biased to improve recovery time.

Referring now to Figure 1 a point contact diode is shown comprising a semi-conductor crystal 1 having an ohmic contact 2 covering substantially all of one face and having another ohmic contact 3 covering substantially all of an opposite face of the crystal 1. A point contact whisker 4 makes rectifying contact with the face of the crystal 1 through an aperture 5 in the ohmic contact 3. A sweeping electric field is provided in the crystal 1 as a result of a difference in potential between ohmic contact 2 and ohmic contact 3. The difference in potential across the crystal 1 is developed by connecting one terminal of a bias battery 6 through conductor 7 to ohmic contact 2 and by connecting a second terminal of the bias battery 6 through conductor 8 to ohmic contact 3. In this embodiment the semi-conductor crystal material 1 is shown as N type and the polarity of the bias battery 6 is such as to sweep the carriers away from the contact whisker 4. The substation of P type semi-conductor material and appropriate polarity changes may readily be accomplished by one skilled in the art, and the contact whisker 4 may be replaced with such items as a PN junction or a gold bonded electrode, these being structures well known in the art as having similar rectifying properties. It is not essential that the ohmic contacts 2 and 3 cover substantially all of the respective surfaces of crystal 1 to which they are applied since, as will be explained in detail later, any electric field produced in the crystal 1 will improve the recovery time. However, a more linear field is achieved by substantially covering the respective surfaces with these ohmic contacts and greater recovery time improvement is realized with lower electric fields.

A semi-conductor diode having a sweeping field applied as shown in Figure 1 exhibits greatly improved performance in pulse type circuitry over a conventional semi-conductor diode. The reason for this may be observed by considering the behavior of a semi-conductor diode connected as shown in Figure 1 when subjected to pulse type operation. When a pulse is applied, the contact whisker 4 of the diode becomes positive with respect to the crystal 1, the diode conducts in the forward direction and the contact whisker 4 serves as an emitter and injects minority carriers into the crystal 1. These carriers diffuse through the crystal 1 to the base shown in Figure 1 as contact 2 or recombine with majority carriers in the bulk of the crystal. The carrier motion is also influenced by the electric field in the crystal 1 which provides a sweeping action tending to cause the carriers to drift toward the base 2. At the end of the duration of the pulse, the contact whisker 4 of the diode goes negative with respect to the crystal 1 and the diode is prevented from conducting in the opposite direction by the high back resistance of the contact whisker 4. At this time the contact whisker 4 performs the function of a collector. In conventional diodes the minority carriers in the vicinity of the collector tend to break down the back resistance and permit current to flow in the reverse direction until they are exhausted. The effect of the electric field in the crystal 1 is to sweep the carriers injected by the contact whisker 4, while the contact whisker 4 serves as an emitter, away from the point of injection, so that at the end of the pulse, when the contact whisker 4 goes negative with respect to the crystal 1 and the contact whisker 4 then serves as a collector, the number of minority carriers reaching the collector is sharply reduced. The reduction of the number of the minority carriers in the crystal 1 that can reach the collector permits the high back resistance of the contact whisker 4 to sharply interrupt the current flow at the end of the pulse duration. This improvement in the switching of the current flow is illustrated in Figure 2 which shows the improvement of recovery time of a diode as a result of impressing an electric field across the crystal.

Figure 2:
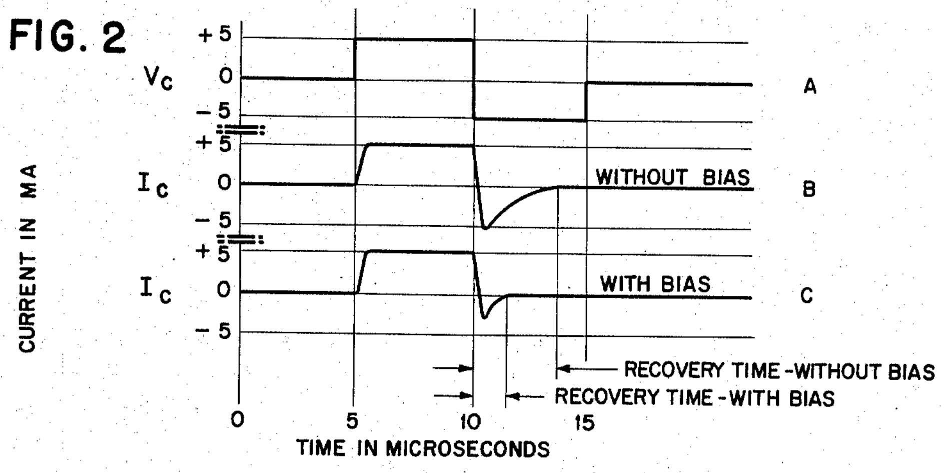
Figure 2 shows the effect of bias on recovery time.

Referring now to Figure 2 curve A represents a variation in collector voltage with respect to time when a positive pulse of 5 volt magnitude and 5 microsecond duration immediately followed by a negative pulse of 5 volt magnitude and 5 microsecond duration is applied to the contact whisker 4 of the diode in Figure 1. Curve B represents the collector current of a conventional diode when the collector voltage varies as shown in curve A. In this diode, due to the presence of minority carriers, the current does not return to zero but reverses direction and flows with a magnitude initially nearly as great as in the forward direction and then gradually diminishing to zero. This current flow is labelled in Figure 2 as recovery time without bias. The application of bias greatly improves the recovery time as may be seen from curve C wherein the magnitude of the reverse current is appreciably reduced and the duration of the recovery time is a much smaller part of the pulse duration time. The recovery time of the diode of Figure 1 is labelled in Figure 2 as recovery time with bias.

Figures 3, 4, 5:
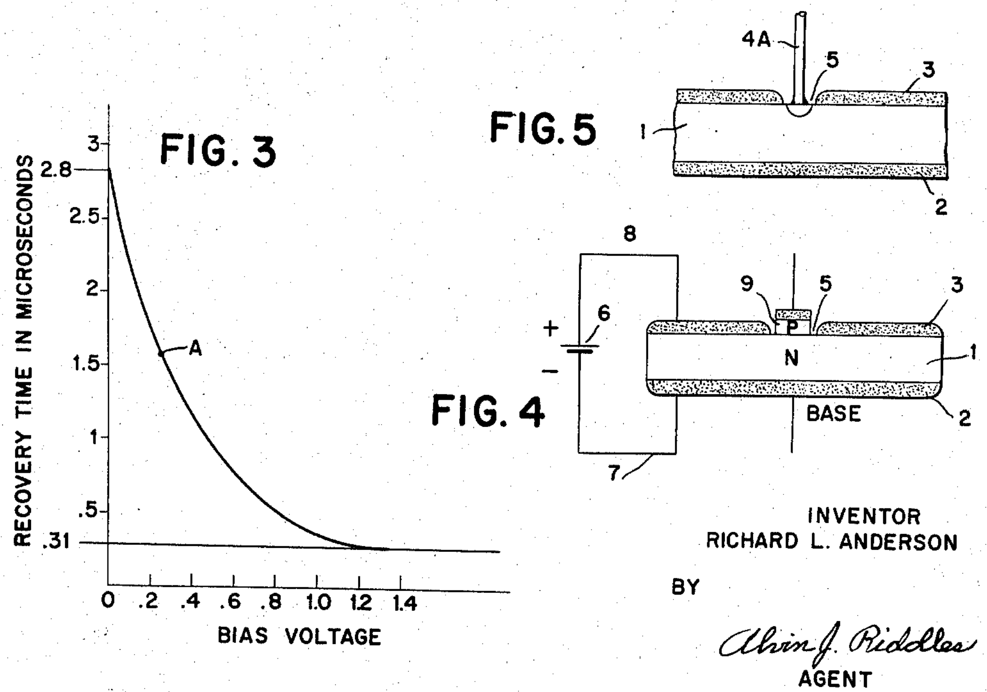
Figure 3 shows the variation in recovery time with magnitude of bias.
Figure 4 shows a junction diode biased to improve recovery time.
Figure 5 shows a gold bonded diode constructed to permit biasing.

A further illustration of the improvement in recovery time as the result of applying a sweeping field may be observed by referring to Figure 3 which shows the variation in recovery time of a diode with the magnitude of the bias across it. Referring now to Figure 3 it will be observed that the recovery time decreases sharply with small values of bias and that the curve levels off at greater application of bias.

To aid in understanding and practicing the invention the following dimensions of a typical semi-conductor crystal are here included to show the magnitude of the impressed electric field, it being understood that the invention is not to be limited to these values since with this information anyone skilled in the art could readily apply an effective electric field to any size semi-conductor crystal. A typical crystal size is 2.5 millimeters by 2.5 millimeters by .75 millimeter in thickness. Referring to the curve of Figure 3 an arbitrary point A has been selected at which the recovery time is ⅔ as long as it was with no electric field and the bias voltage across the crystal is .22 volt which impressed across a .75 mm. crystal produces an electric field of approximately 3 volts per centimeter in the crystal. As may be observed from Figure 3 the application of the bias voltage across the crystal reduced the recovery time in the typical crystal described above from 2.8 microseconds for no bias to .31 microsecond for a field of approximately 19 v. per centimeter produced by a bias of 1.4 volts across the crystal. The above figures are included only to facilitate the practicing of the invention by one skilled in the art and should not be construed as a limitation on the range of effects produced by the electric field.

It is possible within the spirit of the invention to apply the sweeping field to many diode structures well known in the art. One example is the structure shown in Figure 4 which is like that of Figure 1 except that the contact whisker 4 of Figure 1 is replaced by a P–N junction 9. Another example is the structure of Figure 5 which is like that of Figure 1 except that it has a contact whisker 4A made from a gold wire with appropriate impurities and is welded to the surface of the crystal.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A semi-conductor diode having improved recovery time comprising a semi-conductor crystal, a rectifying electrode in contact with one surface of said crystal, a first soldered ohmic contact applied to said one surface so as to be spaced from and at least partially surrounding said rectifying electrode, a second soldered ohmic contact applied to another surface of said crystal, a source of potential, and means connecting said source of potential between said first and said second ohmic contacts in proper polarity to influence carriers injected into said crystal by said rectifying electrode away from said rectifying electrode.

2. A semi-conductor diode comprising a semi-conductor crystal, a first electrode making rectifying contact with one face of said crystal, a second electrode making soldered ohmic contact with another face of said crystal, a third electrode making soldered ohmic contact on said one face of said crystal at points spaced from and at least partially surrounding said first electrode, and an electric field of appropriate polarity impressed on said crystal between said second and said third electrodes and operable to influence carriers injected into said crystal by said first electrode away from said first electrode.

3. In a semi-conductor diode comprising a semi-conductor crystal including a region of one conductivity material and a smaller region of opposite conductivity material separated by a junction barrier; a first soldered ohmic contact applied to said region of one conductivity material spaced from and at least partially surrounding said smaller region of opposite conductivity material; a second soldered ohmic contact applied to another portion of said region of one conductivity material; a source of potential; means connecting said source of potential between said first and said second ohmic contacts in proper polarity to influence carriers injected into said crystal at said junction away from said junction.

4. A semi-conductor diode comprising a semi-conductor crystal, a gold bonded electrode in contact with one surface of said crystal, a first soldered ohmic contact applied to said one surface so as to be spaced from and at least partially surrounding said gold bonded electrode, a second soldered ohmic contact applied to another surface of said crystal, a source of potential, means connecting said source of potential between said first and said second ohmic contacts in proper polarity to influence carriers injected into said crystal at said gold bonded electrode away from said gold bonded electrode.

5. A semi-conductor diode comprising a first zone of one type conductivity, a second zone of opposite type conductivity making junction contact and covering a portion of one surface area of said first zone, a first soldered ohmic contact applied to said second zone, a second soldered ohmic contact applied to said one surface of said first zone at points spaced from and at least partially surrounding said second zone, a third soldered ohmic contact applied to another surface of said first zone, and an electric field of appropriate polarity impressed on said crystal between said second and said third ohmic contacts and operable to influence carriers injected at said junction contact into said crystal away from said junction contact between said first and said second zones.

6. A semi-conductor diode comprising a semi-conductor crystal, a gold bonded electrode making rectifying contact with one face of said crystal, a second electrode making soldered ohmic contact with another face of said crystal, a third electrode making soldered ohmic contact on said one face of said crystal at points spaced from and at least partially surrounding said first electrode, and an electric field of appropriate polarity impressed on said crystal between said second and said third electrodes and operable to influence carriers injected at said rectifying contact into said crystal away from said first electrode.

7. A semi-conductor diode having improved recovery time comprising a semi-conductor crystal, a rectifying electrode in contact with one surface of said crystal, a first soldered ohmic contact applied to said one surface so as to be spaced from and completely surrounding said rectifying electrode, a second soldered ohmic contact applied to another surface of said crystal, a source of potential, means connecting said source of potential between said first and said second ohmic contacts in proper polarity to influence carriers injected into said crystal at said rectifying electrode away from said rectifying electrode.

8. A semi-conductor diode comprising a semi-conductor crystal, a first electrode making rectifying contact with one face of said crystal, a second electrode making soldered ohmic contact with another face of said crystal, a third electrode making soldered ohmic contact on said one face of said crystal at points spaced from and completely surrounding said first electrode, and an electric field of appropriate polarity impressed on said crystal between said second and said third electrodes and operable to influence carriers injected into said crystal at said first electrode away from said first electrode.

9. A semi-conductor diode comprising a semi-conductor crystal, a first electrode making soldered ohmic contact with one face of said crystal, a second electrode associated with said crystal and operable to exhibit asymmetric impedance to current flow, a third electrode spaced from said first electrode at least partially surrounding said second electrode and making soldered ohmic contact with said crystal and an electric field of appropriate polarity impressed on said crystal between said first and said third electrodes and operable to influence carriers injected into said crystal at said second electrode away from said second electrode.

References Cited in the file of this patent

UNITED STATES PATENTS

| | | |
|---|---|---|
| 2,502,479 | Pearson et al. | Apr. 4, 1950 |
| 2,595,052 | Casellini | Apr. 29, 1952 |
| 2,646,609 | Heins | July 28, 1953 |
| 2,666,814 | Shockley | Jan. 19, 1954 |
| 2,709,232 | Thedieck | May 24, 1955 |
| 2,769,926 | Lesk | Nov. 6, 1956 |